(12) United States Patent
Ohgaki

(10) Patent No.: US 6,974,549 B2
(45) Date of Patent: Dec. 13, 2005

(54) METHOD FOR FORMING FINE GROOVES AND STAMPER AND STRUCTURE WITH FINE GROOVES

(75) Inventor: Masaru Ohgaki, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 188 days.

(21) Appl. No.: 10/320,683

(22) Filed: Dec. 17, 2002

(65) Prior Publication Data

US 2003/0127429 A1 Jul. 10, 2003

(30) Foreign Application Priority Data

Dec. 17, 2001 (JP) .............................. 2001-383625

(51) Int. Cl.$^7$ ................................................. C23F 1/00
(52) U.S. Cl. .............................. 216/51; 216/2; 216/11; 216/39; 216/41
(58) Field of Search .................. 216/2, 11, 39, 41, 216/46, 51, 24; 369/275.4, 277, 283; 438/696, 438/947, 962; 359/576; 427/97.2; 65/386

(56) References Cited

U.S. PATENT DOCUMENTS

| | | | | |
|---|---|---|---|---|
| 4,083,098 A | * | 4/1978 | Nicholas | 428/209 |
| 4,568,410 A | * | 2/1986 | Thornquist | 438/724 |
| 5,144,552 A | * | 9/1992 | Abe | 369/275.4 |
| 5,482,885 A | * | 1/1996 | Lur et al. | 438/396 |
| 6,063,688 A | * | 5/2000 | Doyle et al. | 438/424 |
| 6,429,123 B1 | * | 8/2002 | Tseng | 438/642 |
| 2002/0094648 A1 | * | 7/2002 | Lim et al. | 438/296 |

FOREIGN PATENT DOCUMENTS

| | | |
|---|---|---|
| JP | 5-3191 | 1/1993 |
| JP | 8-288499 | 11/1996 |

* cited by examiner

*Primary Examiner*—Parviz Hassanzadeh
*Assistant Examiner*—Maureen G. Arancibia
(74) *Attorney, Agent, or Firm*—Oblon, Spivak, McClelland, Maier & Neustadt, P.C.

(57) ABSTRACT

A method for forming fine grooves including forming a first silicon-nitride layer on a substrate, forming a first poly-silicon layer on the first silicon-nitride layer, forming a second silicon-nitride layer on the first poly-silicon layer, patterning the second silicon-nitride layer, etching the first poly-silicon layer using the patterned second silicon-nitride layer as a mask, forming at least one patterned oxidized portion of the first poly-silicon layer by oxidizing the substrate, first silicon-nitride layer, etched first poly-silicon layer, and patterned second silicon-nitride layer, removing the patterned second silicon-nitride layer and etched first poly-silicon layer such that the first silicon-nitride layer and at least one patterned oxidized portion of the first poly-silicon layer remain on the substrate, and forming a plurality of fine grooves over the substrate by plasma etching the first silicon-nitride layer using the at least one patterned oxidized portion of the first poly-silicon layer as a mask.

10 Claims, 11 Drawing Sheets

METHOD FOR FORMING FINE GROOVES AND STAMPER AND STRUCTURE WITH FINE GROOVES

BACKGROUND OF THE INVENTION

1. Field of the Invention

The present invention relates to a structure with fine grooves such as a stamper for optical disc, an optical disc, a video disc, a CD, a DRAW (direct read after write) disc, a EDRAW (erasable direct read after write) disc, a disc media, an optical element, gratings, a photonic crystal and so on, a method for forming fine grooves and a method for forming a stamper producing the structure with fine grooves.

The present invention is applicable to a semiconductor process and production of a transistor, a memory and so on.

2. Description of Prior Art

Generally, to form a fine pattern, there has been taken a method for shortening wave length of an exposed light source, for example, using KrF, ArF and VUV (vacuum ultraviolet) and simultaneously for performing a high numerical aperture of an optical system. Further, a method of using EUV (soft X ray) and EB (electron beam) is also considered.

In Japanese Patent Laid-Open Publication No. Hei 5-3191, it is utilized that a wall surface of a structure is thickened in appearance by depositing silicon nitride on poly-silicon which is patterned, and therefore the poly-silicon is used for forming a fine pattern.

In Japanese Patent Laid-Open Publication No. Hei 8-288499, thin lines are formed by oxidization of poly-silicon.

However, there is a limitation to perform miniaturization of the pattern by merely shortening a wavelength of exposed light of KrF, ArF and so on.

Further, in aforementioned methods, there is a problem that a high-degree consideration is required to fixtures and fittings such as exposure in vacuum and so on and an expensive device is required.

Furthermore, in Japanese Patent Laid-Open Publication No. Hei 5-3191, there is a problem that it is necessary to form a thick silicon-nitride layer and thus it is difficult to form stably a pattern in order of Å since precision of the pattern is harmed.

Further, in Japanese Patent Laid-Open Publication No. Hei 8-288499, although thin lines are formed by oxidization of poly-silicon, since it is an object thereof to form quantal fine lines and a wet etching is used to patternize a poly-silicon layer, it is not possible to obtain high density of disc land & grooves. There is also a problem that since a basic layer is formed from the silicon layer, a step occurs between under layers of the poly-silicon and the exposed silicon layer.

SUMMARY OF THE INVENTION

It is therefore an object of the present invention to provide a method for forming fine grooves and a method for forming a stamper for producing a structure with fine grooves capable of forming stably a pattern in order of Å and accomplishing high density of disc land & grooves without requiring an expensive device.

It is also another object of the present invention to provide a method for forming fine grooves and a stamper and a structure with fine grooves capable of forming a fine pattern in order of Å by constructing widths of patterned worked lines which reach to a limitation of working by material having a different oxidized rate and thus changing to a parameter which is more finely controllable as thickness of oxidized coat.

To accomplish the above objects, a method for forming fine grooves according to the present invention comprises: a first process for forming a first silicon-nitride layer on a substrate; a second process for forming a first poly-silicon layer on the first silicon-nitride layer; a third process for forming a second silicon-nitride layer on the first poly-silicon layer; a fourth process for patterning the second silicon-nitride layer; a fifth process for etching the first poly-silicon layer using a mask of the patterned second silicon-nitride layer; a sixth process for forming a pattern of oxidized layer on a portion of the first poly-silicon layer by oxidizing the entire substrate formed through the first to fifth processes; and a seventh process for etching a portion of the poly-silicon layer except for the second silicon-nitride layer and the pattern of oxidized layer.

In one embodiment, the first silicon-nitride layer is plasma etched using the oxidized layer as a mask.

Here, if a thickness of the second silicon-nitride layer formed in the third process is $t_1$, an etching rate of the silicon-nitride layer formed in the fifth process is $ER_1$, a thickness $t_2$ of the poly-silicon layer is $t_2$ and an etching rate of the first poly-silicon layer formed in the fifth process is $ER_2$, a relationship of $(t_2/ER_2) \times ER_1 < t_1 < t_2$ is satisfied.

For example, a thickness of the oxidized layer formed in the sixth process is less than ⅓ of a width of line of the second silicon-nitride layer formed in the third process.

In one embodiment, a thickness of the second silicon-nitride layer formed in the third process is less than that of the first silicon-nitride layer formed in the first process.

The method further comprises after the seventh process is completed, a eighth process for forming a second poly-silicon layer on the oxidized and first silicon-nitride layers; a ninth process for forming a third silicon-nitride layer on the second poly-silicon layer; a tenth process for forming a pattern of the third silicon-nitride layer at a position of at least the oxidized pattern formed previously; an eleventh process for etching the second poly-silicon layer with a mask of the third silicon-nitride layer; a twelfth process for oxidizing the entire substrate with layers; and a thirteenth process for selectively etching the third silicon-nitride layer and remained second poly-silicon layer.

In one embodiment, the eighth to thirteenth processes are repeatedly carried-out.

Here, the width of pattern of the uppermost silicon-nitride layer is periodically formed.

In one embodiment, a pattern to be formed is circular or spiral shape.

The first silicon-nitride layer is etched using a mask of a line formation of the pattern of fine oxidized layer formed.

In this way, the formed pattern of fine oxidized layer is selectively removed.

A method for forming a stamper is disclosed and it comprises: metalizing on a surface of such a structure with fine groove formed through the aforementioned processes; growing up a coat of electro-crystallization by said metalizing; and forming said stamper.

In one embodiment, an inverted stamper is formed from the stamper in which the coat of electro-crystallization is grown up.

A structure with fine grooves formed by use of the stamper formed by the above method and an inverted stamper formed from the stamper is also disclosed.

DETAILED DESCRIPTION OF THE PREFERRED EMBODIMENTS (First Embodiment)

A first embodiment of a method for forming fine grooves according to the present invention is shown in FIG. 1. The method comprises forming a first silicon-nitride layer 2 in order of 200 Å in thickness on a substrate 1, forming a first poly-silicon layer 3 in order of 400 Å in thickness on the first silicon-nitride layer 2 and forming a second silicon-nitride layer 4 in order of 100 Å in thickness on the first poly-silicon layer 3. The substrate is made of silicon wafer, glass, silicon dioxide and so on, for example, in the embodiment, of silicon wafer.

Figure 1A:
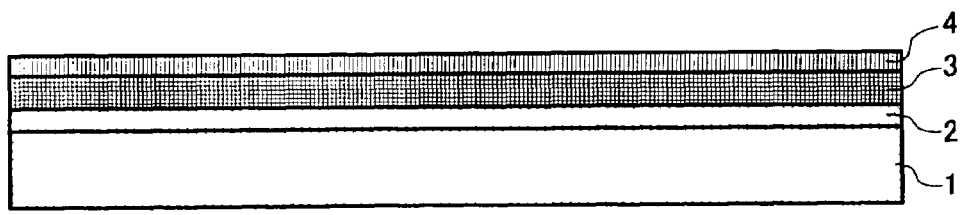
FIGS. 1A–1G are a view showing a method for forming fine grooves according to a first embodiment of the present invention.
Figure 1B:
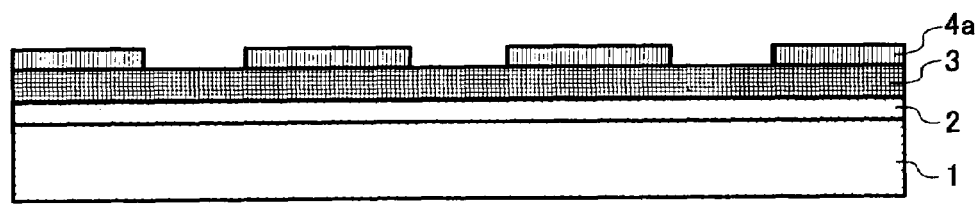

Next, as shown in FIG. 1(B), the second silicon-nitride layer 4 is patterned by being patterned with for example, width of 2000 Å by use of lithography of electron beam to form a patterned second silicon-nitride layer 4a.

Figure 1C:
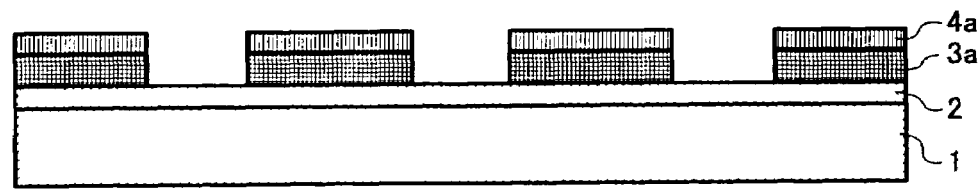

Next, as shown in FIG. 1(C), the first poly-silicon layer 3 is removed by carrying out dry-etching, using the patterned second silicon-nitride layer 4a as a mask to form an etched poly-silicon layer 3a.

Figure 1D:
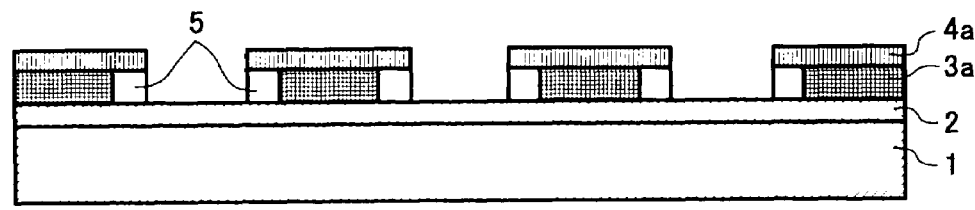

Subsequently, as shown in FIG. 1(D), the entire substrate is oxidized with 500 Å by use of for example, pyrogenic oxidation in the embodiment to form a pattern of oxidized silicon layer 5.

Figure 1E:
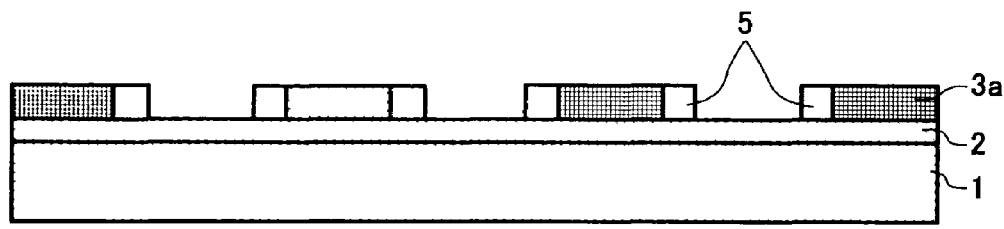

Next, as shown in FIG. 1(E), the patterned second silicon-nitride layer 4a is removed by carrying out etching and so on, using for example, lithography or electron beam.

Figure 1F:
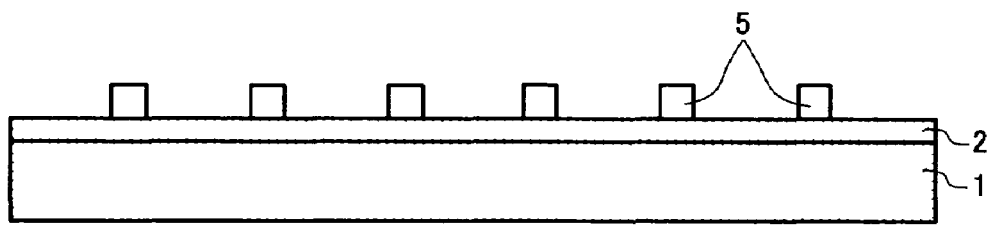

Thereafter, as shown in FIG. 1(F), the etched poly-silicon layer 3a is removed selectively by carrying out dry or wet etching. In the embodiment, the etched poly-silicon layer 3a is adapted to remove selectively by nitric-hydrofluoric acid. As a result, a pattern of the oxidized silicon layer 5 having width of 500 Å is produced with the pitch of 1500 Å in such manner that posts of the oxidized silicon layer 5 which have the width of 500 Å are remained.

Figure 1G:
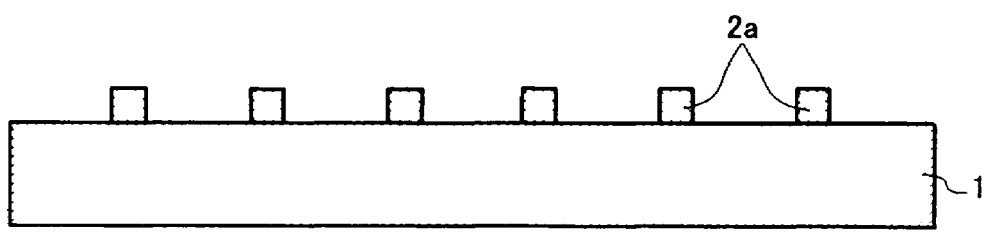

Although the pattern of the oxidized silicon layer 5 is used, as shown in FIG. 1(G), the first silicon-nitride layer 2 may be plasma-etched using the pattern of the oxidized silicon layer 5 as a mask to form a first silicon-nitride fine pattern 2a having 200 Å in thickness.

If a thickness of the second silicon-nitride layer 4 formed in the third process is $t_1$, an etching rate of the second silicon-nitride layer 4a formed in the fifth process is $ER_1$, a thickness of the first poly-silicon layer 3 is $t2$ and an etching rate of the first poly-silicon layer 3 formed in the fifth is $ER_2$, the relationship of $(t_2/ER_2) \times ER1 < t_1 < t_2$ is satisfied.

Consequently, it is possible to form the pattern with high precision without increasing a tolerance at the time the silicon-nitride is patterned, since thickness of the silicon-nitride and poly-silicon layers is set to thin in a possible scope of etching.

(Second Embodiment)

Figure 2:
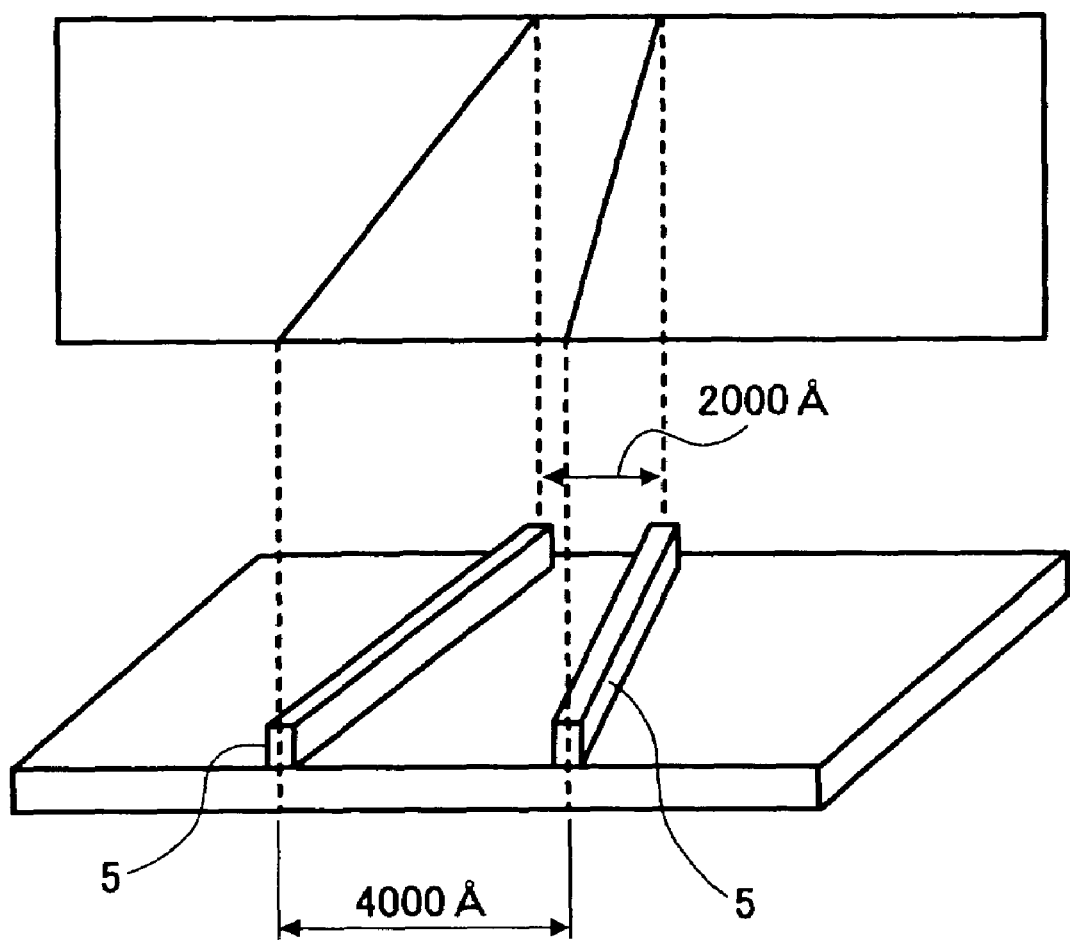
FIG. 2 is a view showing a method for forming fine grooves according to a second embodiment of the present invention.

FIG. 2 illustrates a second embodiment of a method for forming fine grooves according to the present invention.

In FIG. 2, lines of oxidized silicon layers 5 are disposed in such a state that a space between the lines is wide in this side as viewed in FIG. 2. The width of each oxidized coat is constant in 500±50 Å, but the space between the lines can be varied in a scope of 2000 Å to 4000 Å.

(Third Embodiment)

Figure 3A:
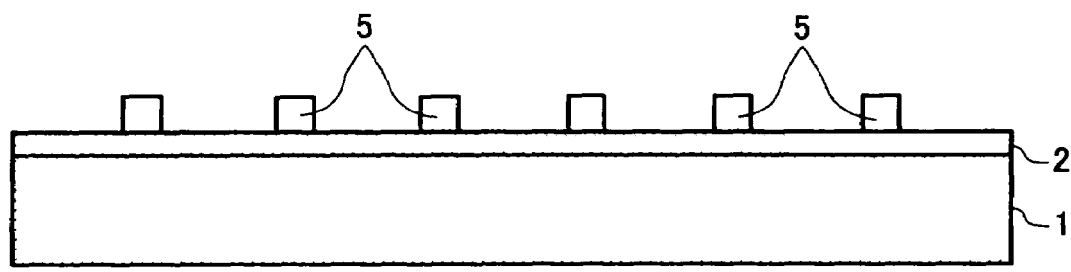
FIGS. 3A–3C are a view showing a method for forming fine grooves according to a third embodiment of the present invention.
Figure 3B:
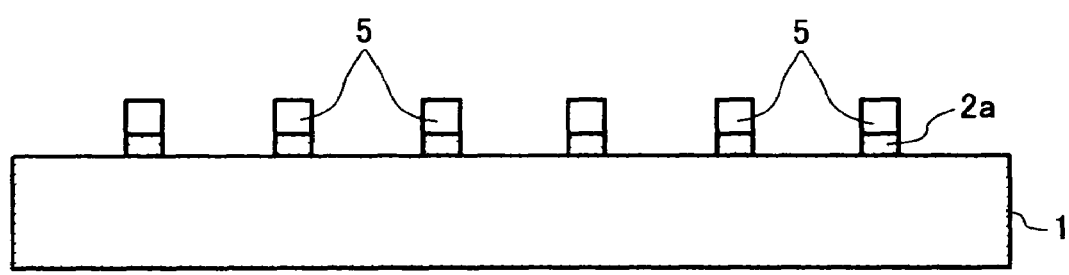
Figure 3C:
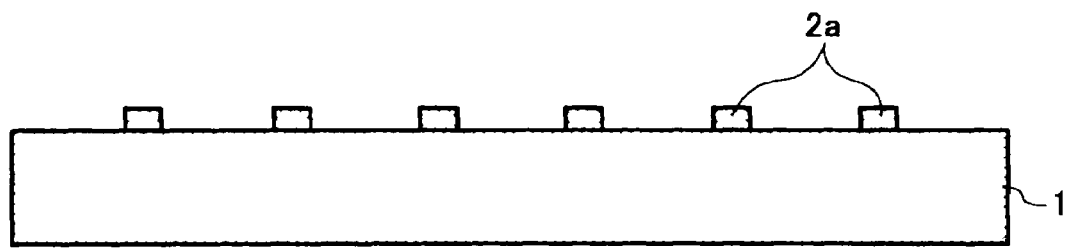

FIG. 3 illustrates a third embodiment of a method for forming fine grooves according to the present invention.

As shown in FIG. 3, the oxidized silicon layer 5 is etched in such a state that the first silicon-nitride layer 2 (100 Å) and oxidized silicon layer 5 are remained, to remain lines of the first silicon nitride pattern 2a (500 Å in width).

(Fourth Embodiment)

FIG. 4 illustrates a fourth embodiment of a method for forming fine grooves according to the present invention.

Figure 4A:
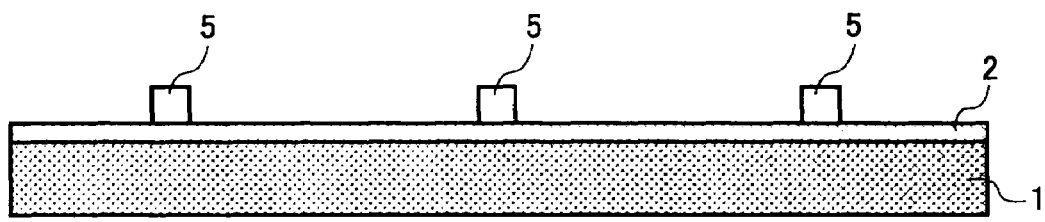
FIGS. 4A–4G are a view showing a method for forming fine grooves according to a fourth embodiment of the present invention.

In any process in the aforementioned first to third embodiments, as shown in FIG. 4(A), the first silicon-nitride layer is formed having 200 Å in thickness on the substrate 1 and then the posts of the oxidized silicon layer 5 having width of 200 Å are formed having pitch of 3000 Å on the first silicon-nitride layer.

Figure 4B:
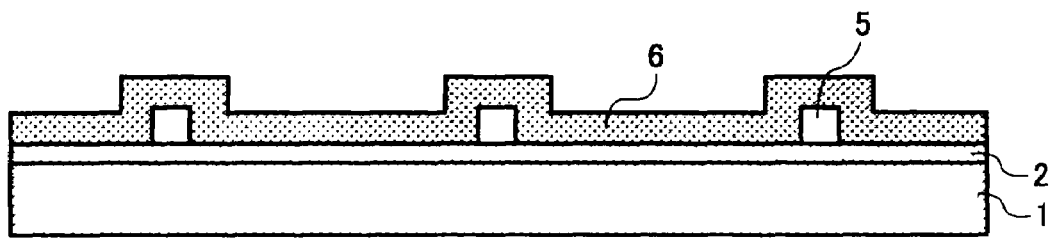
Figure 4C:
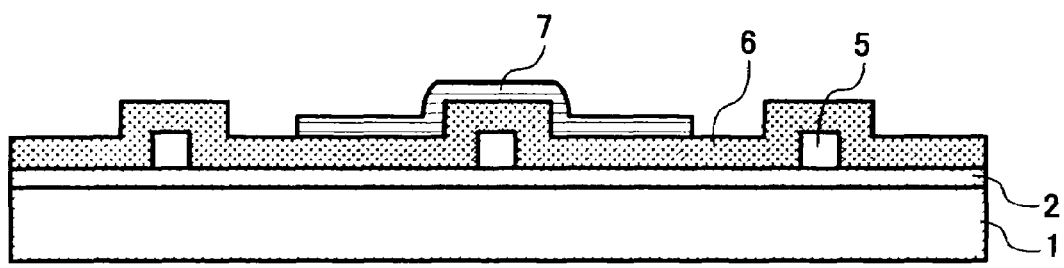

As shown in FIG. 4(B), a second poly-silicon layer 6 is deposited with thickness of 200 Å on the oxidized silicon posts and then a third silicon-nitride layer 7 is deposited with thickness of 50 Å on the second poly-silicon layer 6 as shown in FIG. 4(C).

In FIG. 4(C), a pattern of silicon-nitride containing the central oxidized silicon layer 5 may be formed.

Figure 4D:
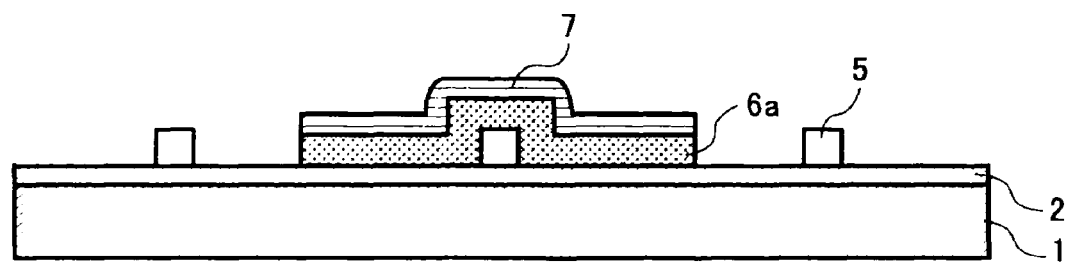

Next, as shown in FIG. 4(D), the second poly-silicon layer 6 is etched using the third silicon-nitride layer 7 as a mask to form an etched second poly-silicon layer 6a.

Figure 4E:
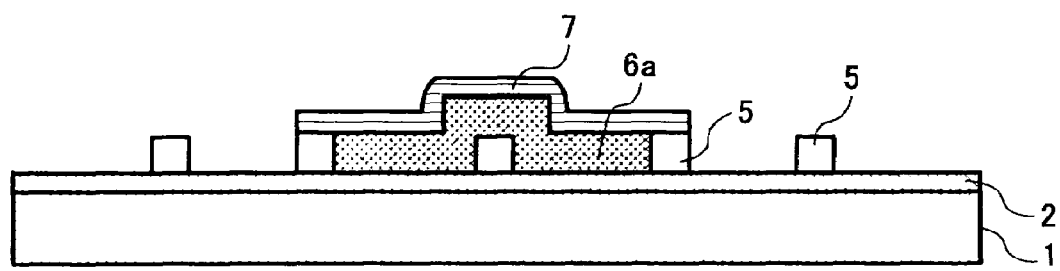

Subsequently, as shown in FIG. 4(E), the entire of the substrate is oxidized.

Figure 4F:
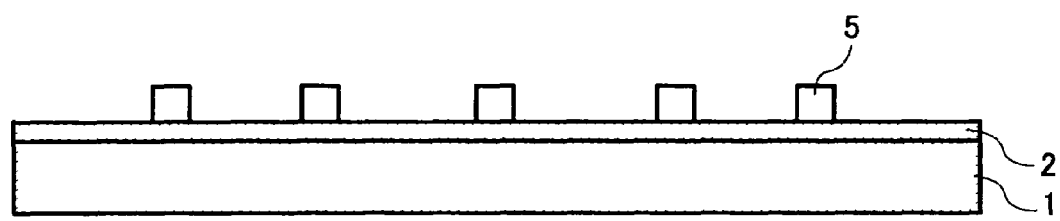

As a result, as shown in FIG. 4(F), it is possible to form the oxidized silicon layer 5 which is oxidized coated line having a high density of two times than that of prior art.

Figure 4G:
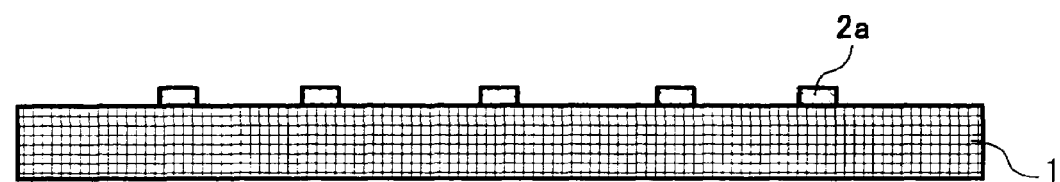

Further, as shown in FIG. 4(G), the silicon-nitride fine pattern 2a is finally formed having 200 Å in thickness and 1500 Å in pitch pattern by a mask of the oxidized silicon layer 5.

(Fifth Embodiment)

FIG. 5 illustrates a fifth embodiment of a method for forming fine grooves according to the present invention.

Figure 5A:
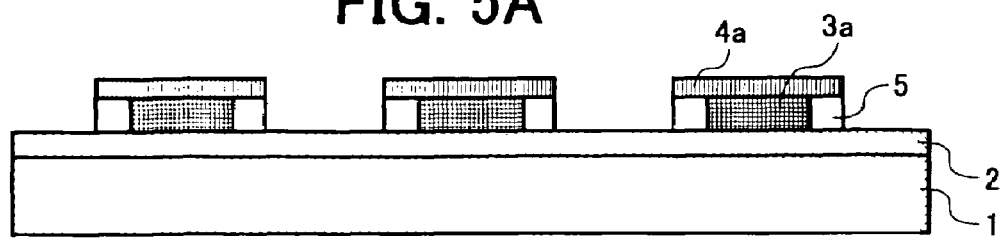
FIGS. 5A–5E are is a view showing a method for forming fine grooves according to a fifth embodiment of the present invention.

Similarly to any one of the first to fourth embodiments, as shown in FIG. 5(A), a substrate 1 is formed from silicon wafer. A thickness of each of the first silicon-nitride layer 2 and patterned second silicon-nitride layer 4a is set as being 200 Å. In other words, each thickness of the upper and lower silicon-nitride layers is set as being 200 Å and a thickness of the etched poly-silicon layer 3a is set as being 400 Å.

Figure 5B:
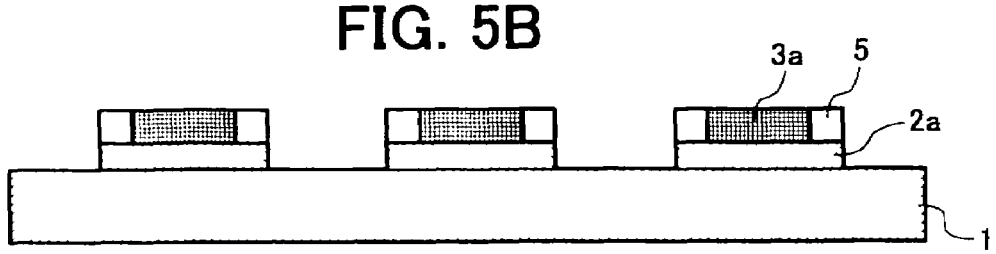

As shown in FIG. 5(B), the first silicon-nitride layer 2 under the etched poly-silicon layer 3a is plasma etched, at this time, the patterned second silicon-nitride layer 4a is simultaneously removed.

Figure 5C:
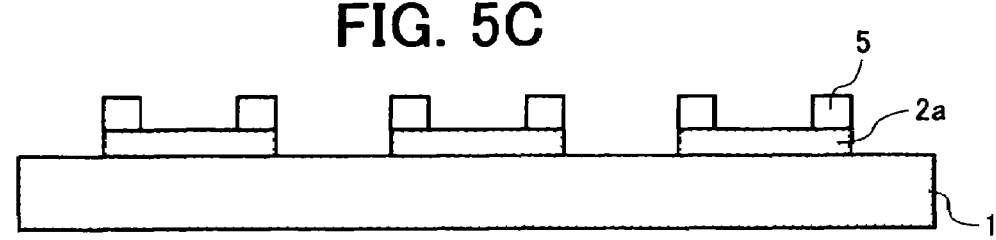

Next, as shown in FIG. 5(C), the etched poly-silicon layer 3a is removed by carrying out dry etching or wet etching of nitric-hydrofluoric acid and so on.

Figure 5D:
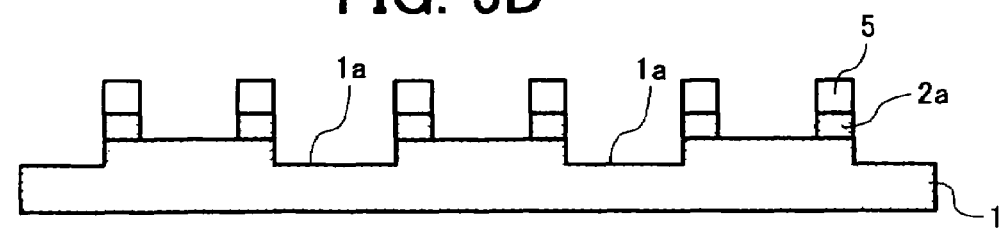

As shown in FIG. 5(D), when the first silicon-nitride layer 2 under the etched poly-silicon layer 3 is plasma etched, and the etching of the surface of silicon of the substrate 1 is also proceeded to form a concave 1a having 300 Å in depth in the surface of the substrate 1.

The concave (step difference) is kept even if the first silicon-nitride fine pattern 2a is removed.

Figure 5E:
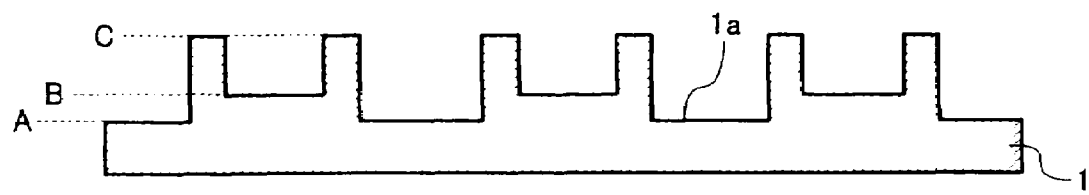

Further, as shown in FIG. 5(E), if selective etching is carried out by masking the oxidized silicon layer 5, a profile having three kinds of steps A, B and C can be obtained on the surface of the substrate.

The difference between steps A and B may be varied in a scope of 100 Å to 1000 Å by change of gas at the time of etching of silicon-nitride.

(Sixth Embodiment)

FIG. 6 illustrates a sixth embodiment of a method for forming five grooves according to the present invention.

Figure 6A:
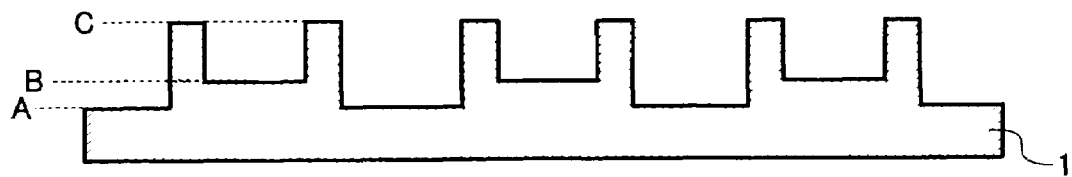
FIGS. 6A–6E are a view showing a method for forming fine grooves according to a sixth embodiment of the present invention.
Figure 6B:
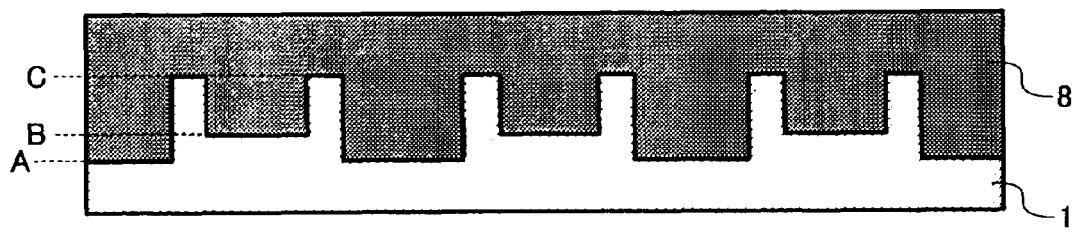
Figure 6C:
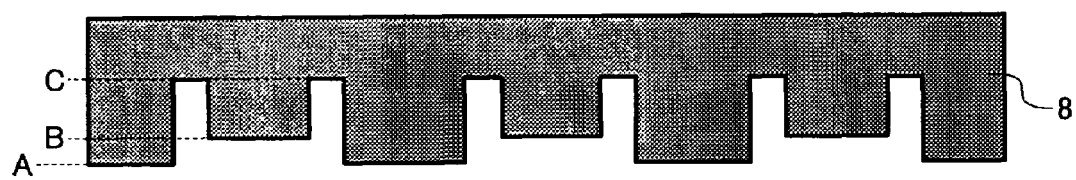

As shown in FIGS. 6(A), (B) and (C), a stamper 8 is formed by carrying out metalized electro-crystallization of Ni or Cu, for example on the substrate 1 in the structure with fine grooves having three stepped groove shape in the fifth embodiment.

Figure 6D:
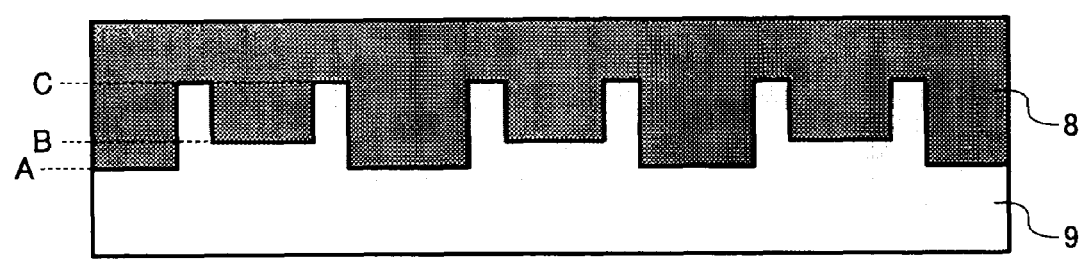
Figure 6E:
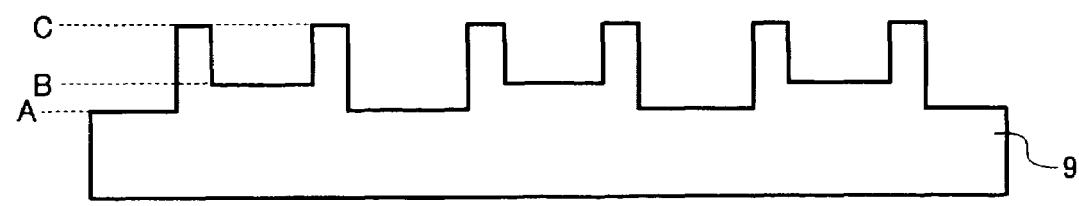

Also, as shown in FIGS. 6(D) and 6(E), after a removed treatment, for example, UVO-treatment, oxidized treatment such as chromic acid treatment and so on, or removed-agent treatment is carried out, the stamper 8 is inversely formed by means of electrotyping of Ni and so on to obtain an inverted stamper 9.

(Seventh Embodiment)

Figure 7:
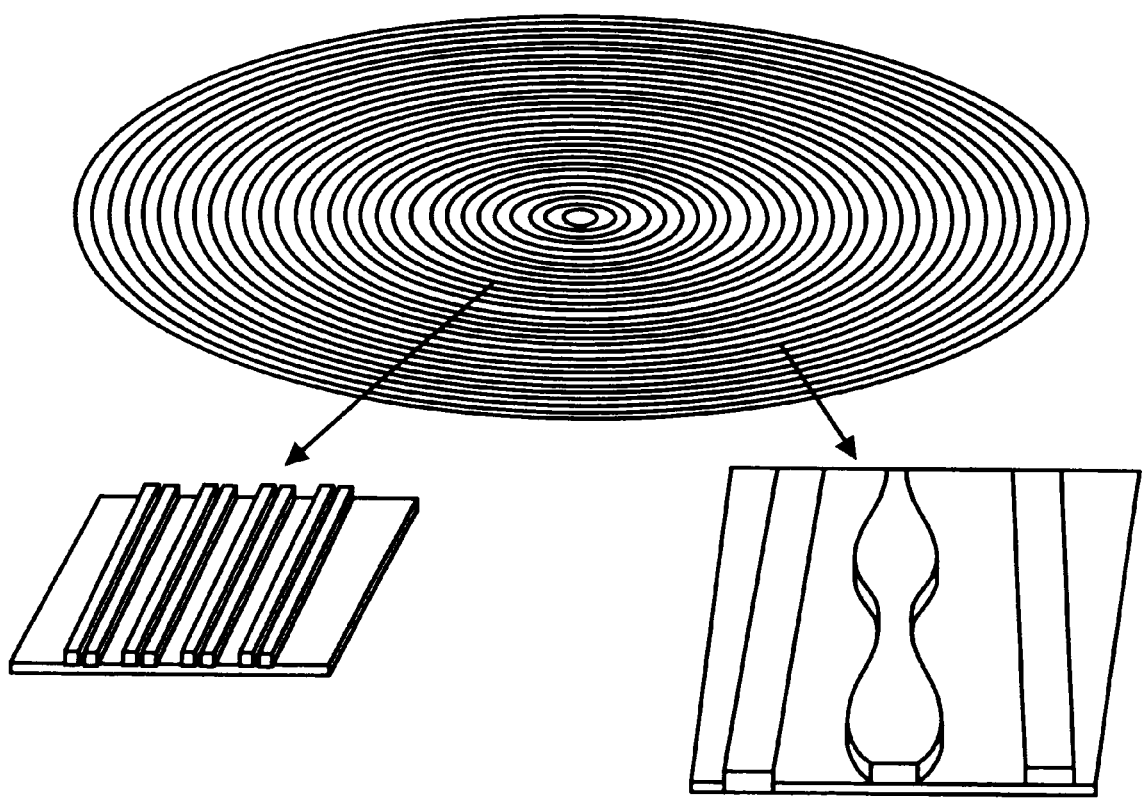
FIG. 7 is a view showing a method for forming fine grooves according to a seventh embodiment of the present invention.

FIG. 7 illustrates a seventh embodiment of a method for forming fine grooves according to the present invention.

Grooves on an optical disc and wobble pattern on the disc are formed by use of any one of the methods in the first to sixth embodiments, as shown in FIG. 7.

(Eighth Embodiment)

Figure 8A:
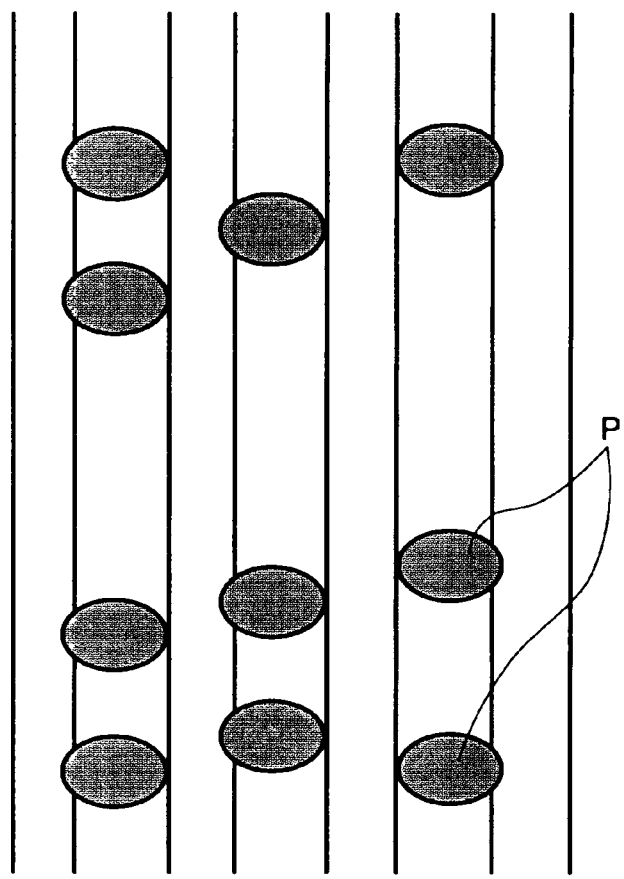
FIGS. 8A and 8B are a view showing a method for forming fine grooves according to a eighth embodiment of the present invention.
Figure 8B:
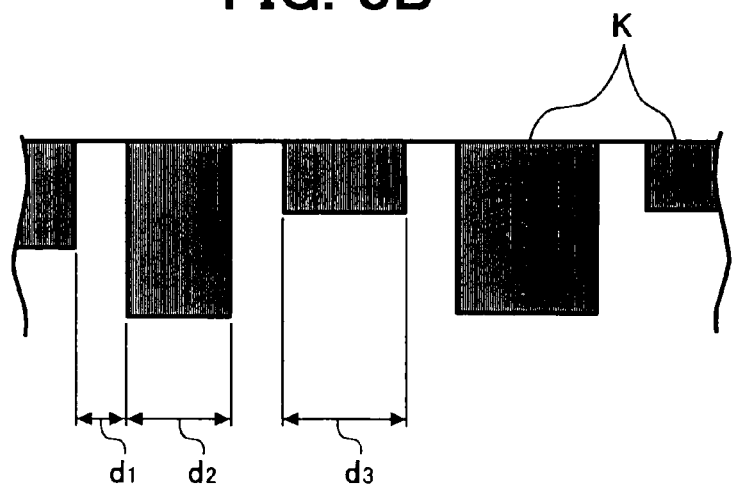

FIG. 8 illustrates an eighth embodiment of a method for forming fine grooves according to the present invention.

In the embodiment, lines and grooves as shown in FIGS. 8(A) and (B) can be formed by use of three stepped shape as shown in FIG. 5(E).

Note that in FIG. 8, reference sign P denotes pits, reference sign K" denotes recording layers and width $d_1$ is 0.05 $\mu$m, widths $d_2$ and $d_3$ are 0.1 $\mu$m.

(Ninth Embodiment)

FIG. 9 illustrates a ninth embodiment of a method for forming fine grooves according to the present invention.

The aforementioned method for forming fine grooves is applicable to formation of gratings as shown in FIG. 9, a photonic crystal and the other optical elements by combination of the method with high isometric etching.

Figure 9A:
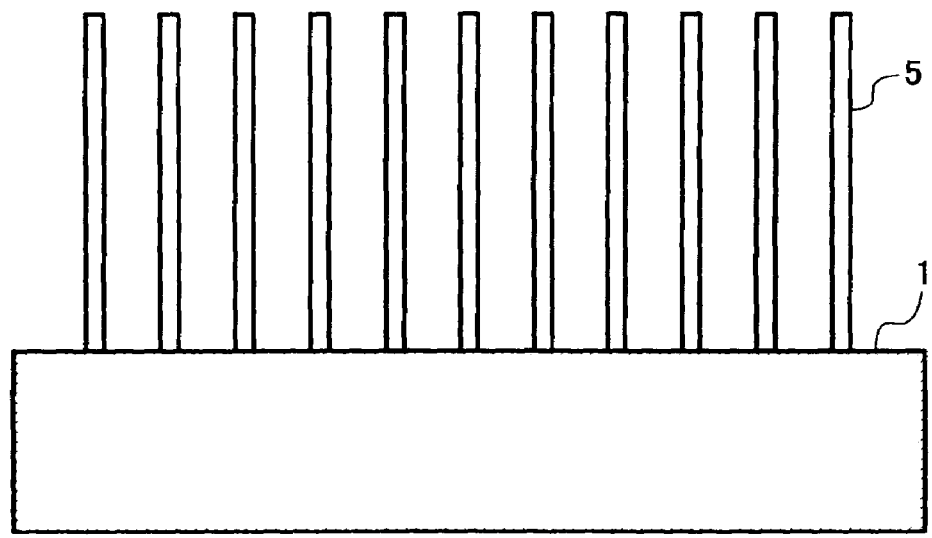
FIGS. 9A and 9B are a view showing a method for forming fine grooves according to a ninth embodiment of the present invention.

In FIG. 9(A), the posts of the oxidized silicon layer 5 having 500 Å in width are produced with 5 $\mu$m in height and 1000 Å in pitch on the substrate 1.

Figure 9B:
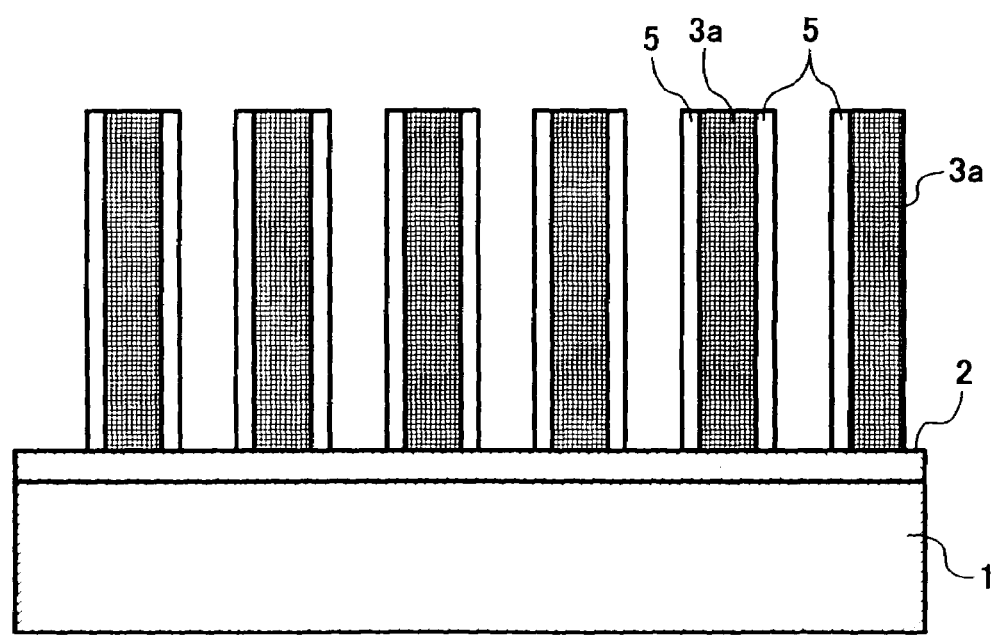

In FIG. 9(B), a sandwich construction in which the poly-silicon layers 3a are disposed between the posts of the oxidized layer 5 is formed.

The present invention can be changed or modified without being limited to the aforementioned embodiments.

As described above, according to the present invention, it is possible to form the width of lines in order of Å since thickness of the silicon oxidized coat can be changed to each width of the lines. It is also possible to accomplish high density and multifunction of recording media, since width of lines of the silicon-nitride can further be thinly divided in spite of exposed method.

Further, since the silicon-nitride layer is set thinly in a scope of thickness that the poly-silicon layer can be etched, it is possible to accomplish a high precise pattern without increasing a tolerance in the patterned work of the silicon-nitride layer.

Also, since formation of the oxidized coat is limited to ⅓ of width of each line of the silicon-nitride layer, it is possible to form stably a profile of shape of the oxidized coat, which occurs from a difference of progressive degree of oxidation.

Further, since thickness of silicon-nitride layer on the poly-silicon layer is less than that of the basic silicon-nitride layer, the substrate is not subject to damage even in a process of etching of the silicon-nitride layer on the poly-silicon layer. Further, it is possible to carry out continuously the eighth to thirteenth processes.

According to the present invention, it is also possible to form fine grooves of more high density by controlling the silicon-nitride which is again formed and patterned position thereof.

Also, it is possible to form fine grooves of high density by controlling further finely the silicon-nitride layer again formed.

It is also possible to obtain signal information of wobble pattern and so on since the control of width of pattern is equivalent to precise control of position of the lines.

It is also possible easily to apply the method of the present invention to disc's function due to formation of the peripheral or spiral pattern.

It is also possible to accomplish optimization of the fine grooves since shape of the lines can be selected.

It is also possible to accomplish high density and multi-function of the recording media for mass-production since shape of grooves can be formed by the stamper.

Also, since concave-convex shape of the lines can be selected, optimization of the fine grooves can be accomplished.

Furthermore, it is to possible form a structure with fine grooves such as multifunctional disc media, high functional optical element and so on, in which is more inexpensive and recorded density is high than that of prior art.

What is claimed is:

1. A method for forming fine grooves, comprising:
   forming a first silicon-nitride layer on a substrate;
   forming a first poly-silicon layer on said first silicon-nitride layer;
   forming a second silicon-nitride layer on said first poly-silicon layer;
   patterning said second silicon-nitride layer;
   etching said first poly-silicon layer using said patterned second silicon-nitride layer as a mask;
   forming at least one patterned oxidized portion of said first poly-silicon layer by oxidizing the substrate, first silicon-nitride layer, etched first poly-silicon layer, and patterned second silicon-nitride layer;

removing the patterned second silicon-nitride layer and etched first poly-silicon layer such that the first silicon-nitride layer and at least one patterned oxidized portion of said first poly-silicon layer remain on the substrate;

forming a second poly-silicon layer on said at least one oxidized portion of said first poly-silicon layer and first silicon-nitride layer;

forming a third silicon-nitride layer on said second poly-silicon layer;

forming a pattern of said third silicon-nitride layer at a position of the at least one oxidized pattern formed previously;

etching said second poly-silicon layer using said third silicon-nitride layer as a mask;

oxidizing an entirety of the substrate, first silicon-nitride layer, second poly-silicon layer and third silicon-nitride layer;

selectively etching said third silicon-nitride layer and remaining second poly-silicon layer such that the first silicon-nitride layer and at least one patterned oxidized portion of said second poly-silicon layer remain on the substrate; and forming a plurality of fine grooves over the substrate by plasma etching said first silicon-nitride layer using the at least one patterned oxidized portion of said first and second poly-silicon layer as a mask.

2. A method for forming fine grooves according to claim 1, wherein said etching satisfies a relationship of $(t2/ER2) \times ER1 < t1 < t2$, where a thickness of said second silicon-nitride layer is t1, an etching rate of said second silicon-nitride layer is ER1, a thickness of said first poly-silicon layer is t2 and an etching rate of said first poly-silicon layer is ER2.

3. A method for forming fine grooves according to claim 1, wherein a thickness of said at least one oxidized portion of said first poly-silicon layer is less than ⅓ of a width of each line of said second silicon-nitride layer.

4. A method for forming fine grooves according to claim 1, wherein a thickness of said second silicon-nitride layer is less than that of said first silicon-nitride layer.

5. A method for forming fine grooves according to claim 1, wherein said forming of said second poly-silicon layer, said forming of said third silicon-nitride layer, said forming of said pattern, said etching of said second poly-silicon layer, said oxidizing of the substrate, first silicon-nitride layer, second poly-silicon layer and third silicon-nitride layer, and said selectively etching of said third silicon-nitride layer and remaining second poly-silicon layer are repeatedly carried-out.

6. A method for forming fine grooves according to claim 1, wherein the width of pattern of the uppermost silicon-nitride layer is periodically formed.

7. A method for forming fine grooves according to claim 1, wherein said at least one patterned oxidized portion of said first poly-silicon layer has one of a circular pattern and a spiral pattern.

8. A method for forming fine grooves according to claim 1, wherein said oxidizing of the substrate, first silicon-nitride layer, second poly-silicon layer and third silicon-nitride layer produces the at least one patterned oxidized portion each having a line shape.

9. A method for forming fine grooves according to claim 8, further comprising selectively removing at least one patterned oxidized portion of said first poly-silicon layer.

10. A method for forming fine grooves according to claim 1, wherein said forming of the first silicon-nitride layer comprises forming the first silicon-nitride layer in order of 200 Å in thickness, said forming of the first poly-silicon layer comprising forming said first poly-silicon layer in order of 400 Å in thickness, and said forming of the second silicon-nitride layer comprises forming the second silicon-nitride layer in order of 100 Å in thickness.

* * * * *